United States Patent [19]

McClure et al.

[11] Patent Number: 5,005,158

[45] Date of Patent: Apr. 2, 1991

[54] REDUNDANCY FOR SERIAL MEMORY

[75] Inventors: David C. McClure; Mark A. Lysinger, both of Carrollton, Tex.

[73] Assignee: SGS-Thomson Microelectronics, Inc., Carrollton, Tex.

[21] Appl. No.: 464,219

[22] Filed: Jan. 12, 1990

[51] Int. Cl.$^5$ .......................... G11C 8/04; G06F 11/20
[52] U.S. Cl. .................................. 365/200; 365/221; 365/230.02; 365/230.03; 365/230.05; 365/240; 371/10.2
[58] Field of Search ................ 365/78, 789.12, 189.02, 365/200, 221, 230.02, 230.03, 230.05, 240, 239, 219; 371/10.1, 10.2, 10.3

[56] References Cited

U.S. PATENT DOCUMENTS

| | | | |
|---|---|---|---|
| 4,254,477 | 3/1981 | Hsia et al. | 365/200 |
| 4,386,421 | 5/1983 | Inagaki | 365/73 |
| 4,630,241 | 12/1986 | Kobayashi et al. | 365/240 |

*Primary Examiner*—Stuart N. Hecker
*Assistant Examiner*—Jack A. Lane
*Attorney, Agent, or Firm*—Dennis T. Griggs; Kenneth C. Hill; Richard K. Robinson

[57] ABSTRACT

A fault tolerant sequential memory includes primary and redundant memory rows (or columns) and primary and redundant shift registers. The redundant memory rows (or columns) and redundant shift registers are formed at the end of the serial chain. Each shift register of each primary and redundant memory block is interconnected with an independent, separately programmable multiplexer logic circuit. Each multiplexer logic circuit includes an independently programmable repair buffer for logically bypassing a defective primary memory block and associated shift registers within the primary memory array. Each redundant memory block includes a multiplexer logic circuit having an independently programmable repair buffer for logically enabling a redundant memory block and shift register at the end of the serial chain. Consequently, a faulty memory block, including its shift register and memory row (or column) is bypassed and is effectively removed from the shifting sequence. The redundant memory block, including a redundant shift register and a redundant row (or column), is inserted at the end of the shift register chain by opening a programmable fuse element.

10 Claims, 5 Drawing Sheets

REDUNDANCY FOR SERIAL MEMORY

FIELD OF THE INVENTION

The present invention is related to monolithic memory arrays of the type implemented on semiconductor chips, and in particular to fault tolerant redundancy for a serial memory array.

BACKGROUND OF THE INVENTION

Large scale integration (LSI) techniques have made possible the construction of memory devices having large arrays of binary storage elements formed on a single chip of silicon. The immediate advantages of such arrangements are high cell density and low power requirements. In the production of monolithic chips, it is not unusual for the yield of good chips from a silicon wafer to be low, especially during early production runs. For each perfect chip produced, there are a number of chips that are almost perfect, having one or more localized defects which render unusable a single cell, a few closely associated cells or clusters of cells.

It will be appreciated that the presence of only one defective cell in an otherwise perfect memory array ca render the entire memory inoperable.

As cell density increases, the likelihood of processing defects increases. Therefore, there is a continuing interest in techniques for improving the yield of memory arrays, and for repairing or otherwise rendering usable those memory arrays having processing defects.

DESCRIPTION OF THE PRIOR ART

Several prior art approaches have been implemented for improving the yield of semiconductor memories For example error correction codes have been used to correct words read from a random access memory in which certain bits of a word are stored in defective cells According to another approach, a discretionary wiring technique is used during processing to bypass defective cells. Additionally, defect tolerant memory systems have been disclosed in which an entire redundant row or column of cells is substituted for a selected row or column containing one or more defective cells In such an arrangement, a redundant row of perfect cells is substituted for a row having one or more defective cells by storing the word address of the defective row in an auxiliary content addressable memory along with the address of the redundant row.

Prior random access memory redundancy techniques are not applicable to the architecture of serial memories such as a first-in, first-out (FIFO) shift register. First-in, first-out memories (FIFOs) provide an important data buffer function for reading and writing operations between two processors of widely differing operating frequencies. FIFO memories allow synchronous operation between the two processors, whereby data can be simultaneously written to the FIFO and read therefrom. The heart of the FIFO is a dual port memory that enables the read and write operations to be independent of each other, thus providing truly asynchronous operation of the input and the output.

The difficulty with implementing redundancy in a serial memory such as the FIFO arises out of the sequential nature of the internal decoding. Traditionally, row and column selection in a sequential memory is performed by a series chain of shift registers. These shift registers are usually in the form of D flip-flops which are clocked at the appropriate time by row and column clocks The flip-flops are placed in a series chain in which the input of an intermediate D flip-flop is driven by the previous flip-flop's output. The output of the last flip-flop is coupled to the input of the first flip-flop of the chain. By making the first flip-flop perform a SET function and the remaining flip-flops perform a RESET function, a shift register is provided which can be properly initialized upon a device RESET to provide sequential shifting from one row (or column) to the next row (or column).

The daisy chaining of flip-flops requires the bypassing of a bad row (or column) shift register and the insertion of a functional row (or column) shift register, while still maintaining the proper shifting sequence. Bypassing of the shift register and row (or column) may be required even though the flip-flop is good but a memory cell in the associated row or column is defective. Accordingly, the prior art redundancy techniques utilized for random access memories cannot be used for the repair of sequential memories.

OBJECTS OF THE INVENTION

Accordingly, the principal object of the present invention is to provide an improved fault tolerant sequential memory array.

Another object of the present invention is to provide a fault tolerant sequential memory array in which circuit defects can be overcome by programmable means without tear down of the package or use of discretionary wiring techniques during processing.

A further object of the present invention is to provide an improved fault tolerant memory system in which a sequential memory array having one or more localized defects can be rendered usable without requiring the use of error correction codes or auxiliary content addressable memory.

SUMMARY OF THE INVENTION

The foregoing objects are achieved in a fault tolerant serial memory in which row (or column) selection is performed by a series array of shift registers which are implemented in the form of D flip-flops. The flip-flops are placed in a series chain, with the first flip-flop of the chain performing a SET function and the remaining flip-flops performing a RESET function. The shift register is initialized upon a device RESET and provides sequential shifting from one row (or column) to the next row (or column).

The fault tolerant sequential memory further includes a redundant array of memory blocks having redundant rows (or columns) and redundant shift registers which are formed at the end of the serial chain. Moreover, the shift register of each primary and redundant memory block is interconnected with an independent, separately programmable multiplexer logic circuit. Each multiplexer logic circuit includes an independently programmable fuse element for logically bypassing a primary memory block within the primary memory array. Likewise, each redundant memory block includes a multiplexer logic circuit having an independently programmable fuse element for logically enabling a redundant memory block and redundant shift register at the end of the serial chain.

According to this arrangement, each primary memory bock is fully operational and each redundant memory block is logically bypassed prior to opening the separately programmable fuse elements. A faulty memory block is bypassed by opening its programmable fuse element, which places its multiplex transmission gate in a non-conducting state This permanently disables the row (or column) and shift register associated with that particular faulty memory block. It also permits the output of the previous shift register stage to drive the input of the next stage following the disabled faulty stage Consequently, the faulty memory block is bypassed and is effectively removed from the shifting sequence.

A redundant memory block is inserted at the end of the shift register chain by opening the program fuse element associated with that particular redundant shift register The redundant shift register and its associated memory block is normally bypassed and is effectively ignored, unless its programmable fuse element is opened. When the programmable fuse element is opened, the redundant memory block and the row shift register is inserted into the series shift register chain and the redundant row (or redundant column) becomes operational.

BRIEF DESCRIPTION OF THE DRAWINGS

Other features and advantages of the present invention will be appreciated by those skilled in the art upon reading the detailed description which follows in connection with the attached drawings, wherein.

DETAILED DESCRIPTION OF THE PREFERRED EMBODIMENT

In the description which follows, the invention is described with reference to a first-in, first-out (FIFO) memory which is implemented by CMOS/LSI techniques on a semiconductor chip. In the exemplary embodiment described herein, the FIFO serves as a communication link between two independent processors.

Figure 1:
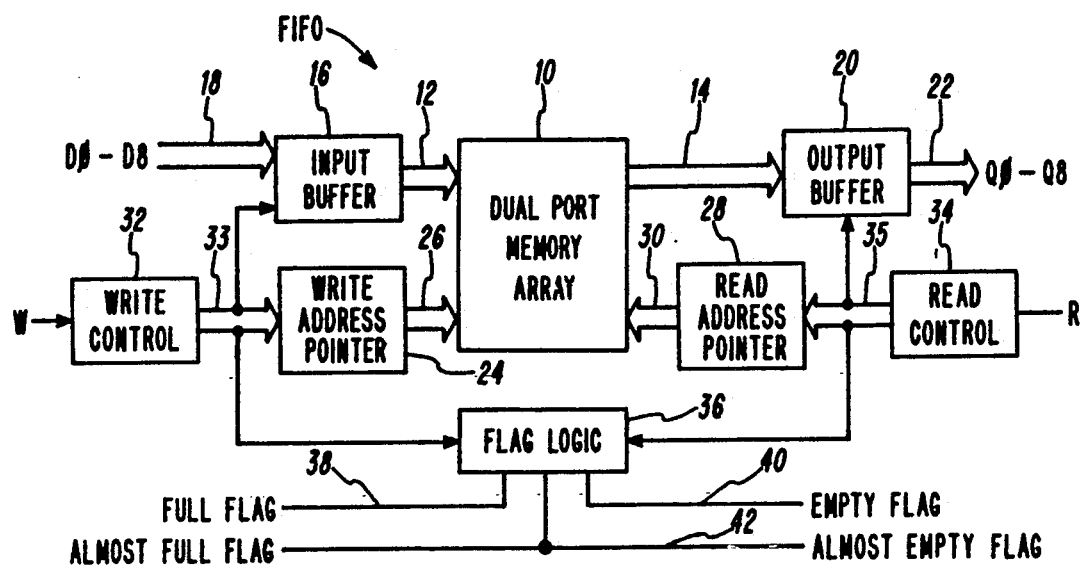
FIG. 1 illustrates a block diagram of a prior art dual port FIFO sequential memory.

Referring now to FIG. 1, there is illustrated a block diagram of a first-in, first-out (FIFO) memory, which includes a dual port memory array 10 which has a data input port connected to a bus 12 and a data output port connected to a bus 14. The bus 12 is output from an input buffer 16 which is connected to input data D0–D8 on an input bus 18, and the bus 14 is input to an output buffer 20 which provides output data Q0–Q8 on an output bus 22.

Figure 2:
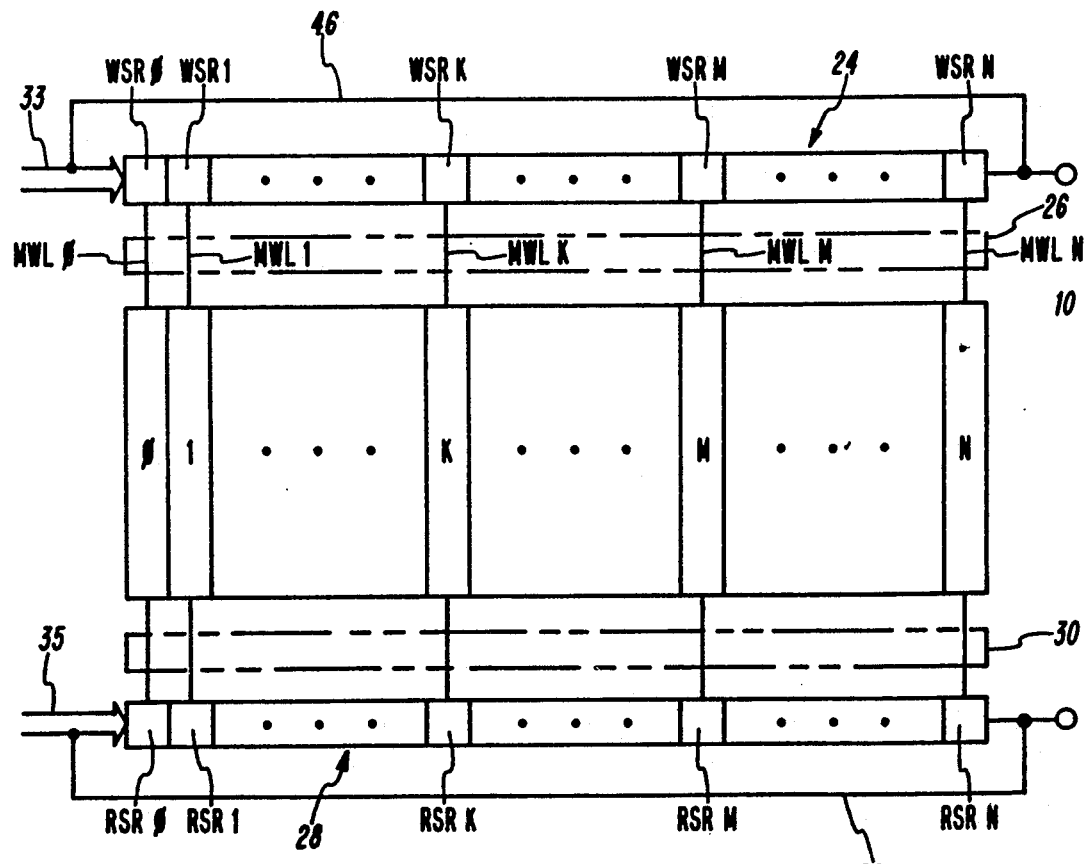
FIG. 2 illustrates a simplified logical diagram of the prior art dual port FIFO sequential memory of FIG. 1.

As shown in FIG. 2, the dual port memory 10 includes a serial array of (N+1) addressable memory blocks 0, 1, 2, ... N operable to be written to from the bus 12 and read out to the bus 14. As used herein, the term "block" means and refers to a row or column of memory cells or other memory storage devices. Each block is 9-bits wide to carry a single eight-bit byte plus a parity bit. Although nine data bits are utilized in this example, any number of data bits can be accommodated in accordance with the operation of the present invention. It should be understood that any type of FIFO memory block, such as registers, etc., can be utilized in association with the present invention.

The memory array 10 has a WRITE address input signal W connected to a WRITE address pointer 24 through a bus 26. The READ address input signal R is connected to the output of the READ address pointer 28 through a bus 30. The address pointers 24 and 28 are cyclical counters which are incremented by various control signals. The WRITE address pointer 24 is controlled by a WRITE control circuit 32 that is connected to the WRITE input signal W and the READ address pointer 28 is controlled by a READ control circuit 34 that receives the READ input signal R. By utilizing the cyclical counters, the next sequential address can be written to for each new data word input to the memory array 10 and the READ pointer 28 can be incremented to read out data stored at the next sequential address.

The output 33 of the WRITE control circuit 32 is input to the input buffer 16, and also to a flag logic circuit 36, which also receives on the input thereof the output of the READ control circuit 34. The output 35 of the READ control circuit 34 is input to the READ address pointer 28 and to the output buffer 20. The flag logic circuit 36 is operable to determine the proximity of the WRITE address pointer 24 and the READ address pointer 28 by internally counting each WRITE and READ operation and comparing the count values A full flag is output on a line 38 when the READ pointer 28 and the WRITE pointer 24 are at a maximum distance apart and an empty flag is output on a line 40 when the READ pointer 28 and the WRITE pointer 24 are equal An almost full/almost empty flag is output on a line 42 to indicate a proximity in between empty and full.

In FIG. 2, a portion of the control circuitry is illustrated showing WRITE address pointer 24 which contains a single binary 1 pointer bit shown as occupying row shift register pointer cell WSRM. The pointer bit is shifted serially through the WRITE address pointer 24 by overhead circuitry to indicate the memory block next to be written into. In this instance, the dual port memory 10 is partly full and the portion up to memory block M-1 has been written into by the first processor, with memory block M being pointed to by master write line MWLM as the next memory block to undergo a WRITE operation. When the Nth memory block has been written into, the pointer bit is shifted along WRITE pointer return line 46 back to the input of the first memory block 0.

Sometime after the first memory block 0 has been written into, the second processor begins to read the information. It starts at memory block 0 and continues reading at its natural speed until it reads everything that the first processor has written. In this example, the Kth memory block is the next to be read and is pointed to by READ pointer cell RSRK. As in the case of the WRITE shift register, the READ pointer bit is shifted to memory block 0 along a READ pointer return line 50.

Figure 3:
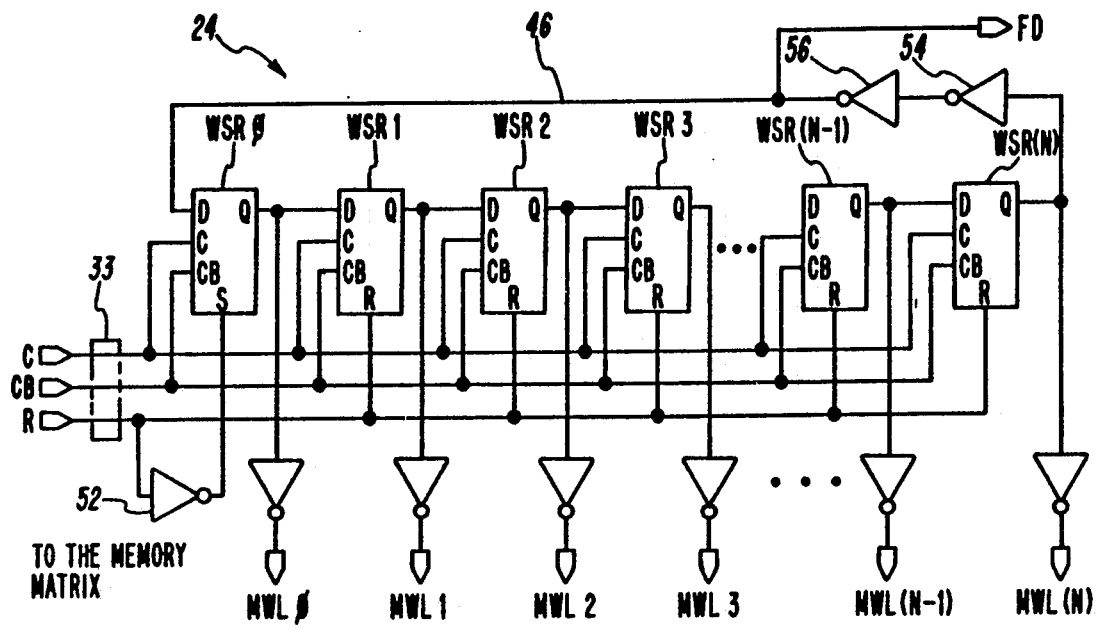
FIG. 3 is a logical block diagram of a prior art series array of row shift registers interconnected to define a row shift pointer.
Figure 4:
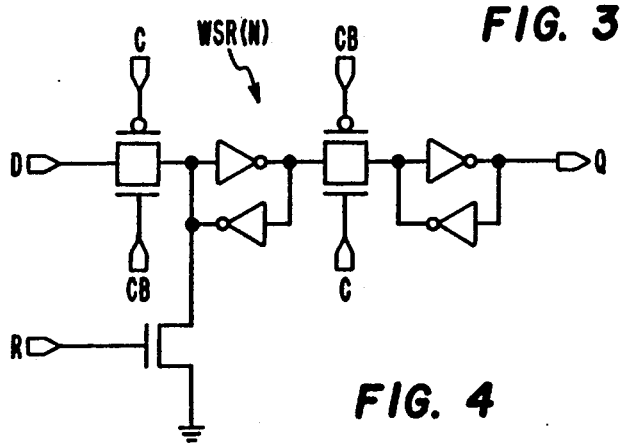
FIG. 4 is a logic diagram of a D flip-flop utilized in the row shift registers of FIG. 3.

Referring now to FIG. 3 and FIG. 4, the WRITE address pointer 24 is realized by a serial array of shift registers WSR0-WSRN. The shift registers WSR1-WSRN are in the form of a conventional D flip-flop circuit as illustrated in FIGURE 4. The first shift register WSR0 is connected to perform a SET function, and the other shift registers WSRI-WSRN are each connected to perform a RESET function. The shift registers are clocked at the appropriate time by a clock signal C, a complement clock signal CB, and a RESET signal R. The flip-flops WSR0-WSRN are connected in a series chain, with the output of the last flip-flop WSRN providing an input on the return line 46 to the first shift register WSR0. By connecting the first flip-flop WSR0 to perform the SET function, and the remaining registers WSR1-WSRN each performing the RESET function, the WRITE address pointer 24 can be properly initialized upon a device RESET and provide sequential shifting from one row (or column) to the next row (or column).

Figure 8:
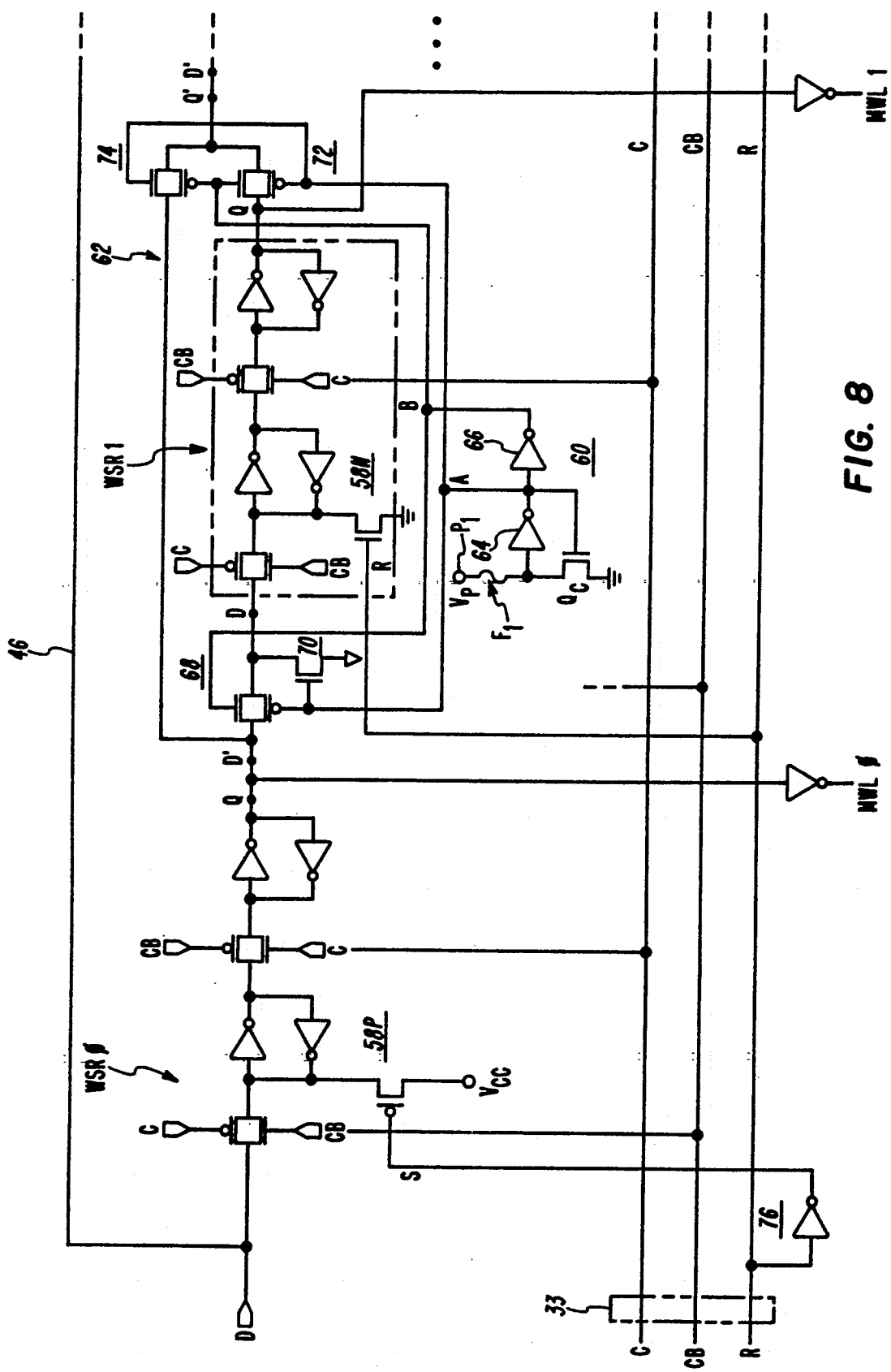
FIG. 8 is a circuit diagram of a primary RESET row shift register interconnected with the multiplex logic circuit of FIG. 6 and the programmable fuse element circuit of FIG. 5; and, FIG. 9 is a circuit diagram which illustrates the interconnection of a multiplex logic circuit and programmable fuse circuit with the first redundant row shift register which is coupled to the last primary row shift register of FIG. 7.

The D flip-flop of the SET shift register WSR0 is shown in FIG. 8. In that flip-flop, the N channel FET transistor 58N is replaced by a P channel FET transistor 58P, and its source is connected to $+V_{CC}$. Otherwise, the D flip-flop WSR0 is the same as that shown in FIG. 4.

The initial shift register WSR0 is connected to the RESET line R through an inverter 52 to configure appropriate logic for the SET D flip-flop. The second and each succeeding WRITE RESET shift registers WSR1-WSRN each include a conventional D flip-flop as illustrated in FIG. 4, which is connected to perform a RESET function. The output Q of the last shift register WSRN is connected to the D input of the initial shift register WSR0 through a serially connected pair of inverters 54, 56. A signal line FD feeds an expansion control circuit (not illustrated).

The address selection of a specific one of the memory blocks (0, 1, . . . , N) is based on the operation of the serially connected shift registers WSR0-WSRN which are connected in a daisy chain configuration. In the example of FIG. 3, the first shift register WSR0 is SET, and each remaining shift register is automatically RESET, so that a logic 1 appears at the Q output or shift register WSR0 The Q outputs of the remaining shift registers WSRI-WSRN are all at logic 0, so there is a single logic 1 that is being shifted through the series connected pointer chain 24. This technique is used to serially select the row (or column) memory cell location. Accordingly, upon a logic high value for the clock signal C, the logic high Q output is advanced one register upon each clock pulse. The logic 1 output keeps shifting through the series connected chain 24 whereby a new master word line is selected from the series (MWL0 , . . . , MWLN) upon each clock pulse. This selection of a single master word line is repeated on the subsequent clock cycle until the last register WSRN is selected.

Each primary block of memory 10 includes data storage cells arranged in rows (or columns) with each row (or column) of cells being coupled through data node input/output circuitry for transferring data D0-D8 out of the input buffer 16 through the bus 12 and into the memory cells of the block being pointed to during a WRITE operation. Likewise, each row (or column) of cells is coupled through data node input/output circuitry for transferring data out of the output buffer 20 through the bus 22 during a READ operation. It will be appreciated that a defect in a single cell of a row (or column), or a defect in a single shift register associated with that row (or column) will render the entire FIFO inoperable.

The redundancy technique of the present invention is block redundancy in that one full block of memory cells together with its READ/WRITE shift registers is bypassed. According to the redundancy technique of the invention, one or more additional redundant memory blocks together with redundant WRITE/READ shift registers are formed at the end of the series chain In the example shown in FIG. 7, four redundant memory blocks N+1, N+2 N+3 and N+4 are appended to the dual port memory 10, along with redundant write shift registers WSR(N+1)-WSR(N+4). Likewise four redundant READ shift registers RSR(N+1)-RSR(N+4) are appended to the end of the READ address pointer chain 28.

Upon determining during testing that a certain memory block is faulty, that particular memory block is selectively bypassed by programmable means and a redundant memory block, including redundant WRITE/READ shift registers, are selectively inserted at the end of the sequential memory. The redundant block is logically enabled, not only as probed during wafer testing, but after encapsulation during data retention tests If a bad bit is detected in a certain memory block, or if a fault is detected in the WRITE or READ shift register for that memory block, the redundant block is logically enabled by programmable means either at the wafer level or at the package level According to this technique, even though only one bit is bad, an entire block of memory including the READ shift register and WRITE shift register are bypassed. This block redundancy technique is independent of any address in consideration because it duplicates the entire row (or column), WRITE shift register and READ shift register at the end of the serial array, while logically bypassing the faulty memory block.

Figure 5:
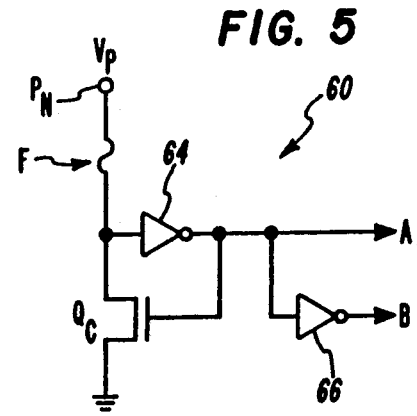
FIG. 5 is a logic diagram of a programmable fuse element circuit which is adapted for use in combination with the multiplex logic circuit of FIG. 6.
Figure 6:
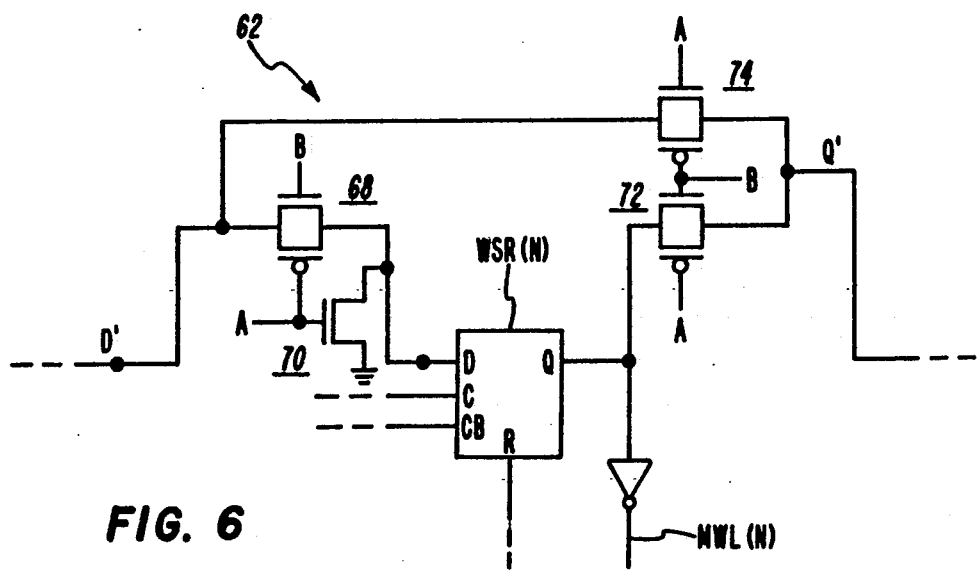
FIG. 6 is a block diagram which illustrates the interconnection of a multiplex logic circuit with a D flip-flop row shift register.

Memory block bypass is implemented by a repair buffer 60 and a multiplex logic circuit 62 as illustrated in FIG. 5 and FIG. 6. The interconnection of the repair buffers 60 with the multiplexer logic circuit 62 is illustrated in FIG. 8.

Referring again to FIGS. 5 and 6, the repair buffer 60 has a conductive fuse F electrically connected between a program terminal $P_N$ and the drain of a control transistor $Q_C$. The condition of the programmable fuse F determines the data path selected by the multiplexer logic circuit 62 A logic high level or logic low level will appear on the repair buffer output lines A, B depending upon the open circuit or closed circuit condition or the fuse F. The fuse F is preferably a conductive metallization deposit of aluminum/silicon/copper alloy. Alternatively, the fuse F can be made of polycrystalline silicon.

The resistance of the programmable fuse F is relatively low, typically 100-200 ohms, whereby a low resistance conductive path is established for the control transistor $Q_C$. Control transistor $Q_C$ is an N channel FET transistor, and its gate is coupled to a potential $V_P$ applied to the program terminal $P_N$ through the fuse F and an inverter 64. Accordingly, control transistor $Q_C$ is turned off when the fuse F is intact. The enhancement mode transistor $Q_C$ is normally OFF, and in the absence of a turn on signal, it is clamped in the OFF condition by the inverter 64 when the fuse F is conducting current from a positive program voltage $V_P$. Although the voltage drop across the fuse F is not zero, the potential applied by the inverter 64 to the gate of the enhancement mode transistor $Q_C$ is substantially at zero, thereby driving $Q_C$ to the OFF condition. With fuse F intact and control transistor $Q_C$ turned off, a logic zero level is applied on control line A, and a logic one level is applied to control line B.

Alternatively, the fuse F can be permanently opened thermally by directing a high energy laser beam onto the fuse.

Upon application of electrical or laser programming energy, the fuse F will be permanently altered from a closed circuit low resistance condition to an open circuit high impedance condition, thereby permanently disconnecting the program potential $V_P$ from the drain of control transistor $Q_C$. The output of the inverter 64 rises to a logic high level, thereby turning on the control transistor $Q_C$. This drives control line signal A to logic one, and control line signal B to logic zero.

Referring to FIG. 6, the repair buffer output control signals A, B are applied to the control gates of a transmission gate 68, a bypass control transistor 70, a transmission gate 72 and a transmission gate 74. The transmission gate 68 is connected in series between the input node D' which is coupled to the Q' output of the preceding stage and the D input of the Nth shift register WSRN. The bypass control transistor 70 is connected in common with the P channel gate of the transmission gate 68. The transmission gate 72 is connected in series between the Q output of the Nth shift register WSRN and the output node Q' which is connected to the input of the next succeeding stage (N+1). Finally, the transmission gate 74 is connected across input node D' and output node Q' in parallel with the series connected transmission gates 68, 72 and the Nth shift register WSRN.

Assuming that the memory block N which is associated with the WRITE shift register WSRN contains an array of perfect cells, and the WRITE/READ shift registers WSRN and RSRN are also perfect, the polysilicon fuse F will be intact, whereby a low resistance conductive path is established from the program terminal $P_N$ and the drain of the control transistor $Q_C$. $Q_C$ is turned OFF, with the result that a logic low signal appears on repair buffer signal line A, and a logic high signal appears on repair buffer control line B. With repair buffer signal A being logic low and repair buffer signal B being logic high, the bypass transistor 70 is turned OFF, transmission gate 68 is turned ON and transmission gate 72 is turned ON, thereby establishing a first conductive path from multiplexer input node D' to shift register input node D, and establishing a second conductive path C from shift register output node Q to multiplexer output node Q'. At the same time, transmission gate 74 is turned OFF, with the result that input node D' is directly connected to the input node D of the shift register WSRN, and the Q output of the WSRN shift register is directly connected to the Q' output of the multiplex circuit 62. The foregoing direct logical connection between D and D and Q and Q' is maintained continuously as long as a logic high program signal $V_P$ is applied to the program pin $P_N$.

If during testing, it is determined that a memory block has one or more faulty cells, or if it is determined that one of the shift registers coupled to that memory block is faulty, it is desirable then to bypass that particular primary memory block, including its shift registers. This is carried out by impressing a relatively high negative voltage, for example $V_{PP} = -25$ volts DC which is derived from a separate power supply potential $V_{PP}$. The application of the negative repair signal causes the gate of the control transistor $Q_C$ to conduct, thereby turning on $Q_C$ and causing it to conduct, thereby delivering heavy current flow through the polysilicon fuse F.

After the fuse F has been opened, the drain of the control transistor $Q_C$ is open circuited, and the gate of the control transistor $Q_C$ is maintained in a conducting mode by the inverter 64. Thus, upon opening of the fuse F, the repair buffer output signal A rises to logic 1 level, and the repair buffer output signal B falls to logic 0 level.

Thus, when the fuse F has been opened, the repair buffer 60 applies a logic 1 (signal A) to the gate of the bypass transistor 70, which causes it to turn on and drive the input node D of the shift register WSRN to logic 0, thereby ensuring that the faulty block is not accessed. At the same time, series connected transmission gates 68, 72 are turned OFF, while the parallel connected transmission gate 74 is turned ON, thereby directly connecting input node D' to output node Q'. As this occurs, the output of the preceding stage (N−1) is directly connected to the input of the (N+1) stage, thereby completely bypassing the Nth memory block, and its shift register WSRN. Thus with the fuse F permanently programmed to its open circuit condition the primary block N and its shift register WSRN are permanently bypassed out of the shift register chain 24

The complete interconnection of the repair buffer 60 and multiplex logic circuit 62 with WRITE shift register WSR1 is illustrated in FIG. 8.

In FIG. 8, it will be noted that memory block 0 and its associated shift register WSR0 does not include redundancy because the shift register 0 is configured as a SET shift register, and requires a P channel enhancement mode transistor 58P having a gate driven through an inverter 76. Because the foregoing P channel enhancement mode transistor 58P and inverter 76 are only connected in the initial memory block of the chain 24, redundancy cannot be accomplished for the initial memory block since that particular memory block in which the shift register performs a SET function must always occur as the initial shift register and cannot be located at any other position in the shift register chain.

Figure 7:
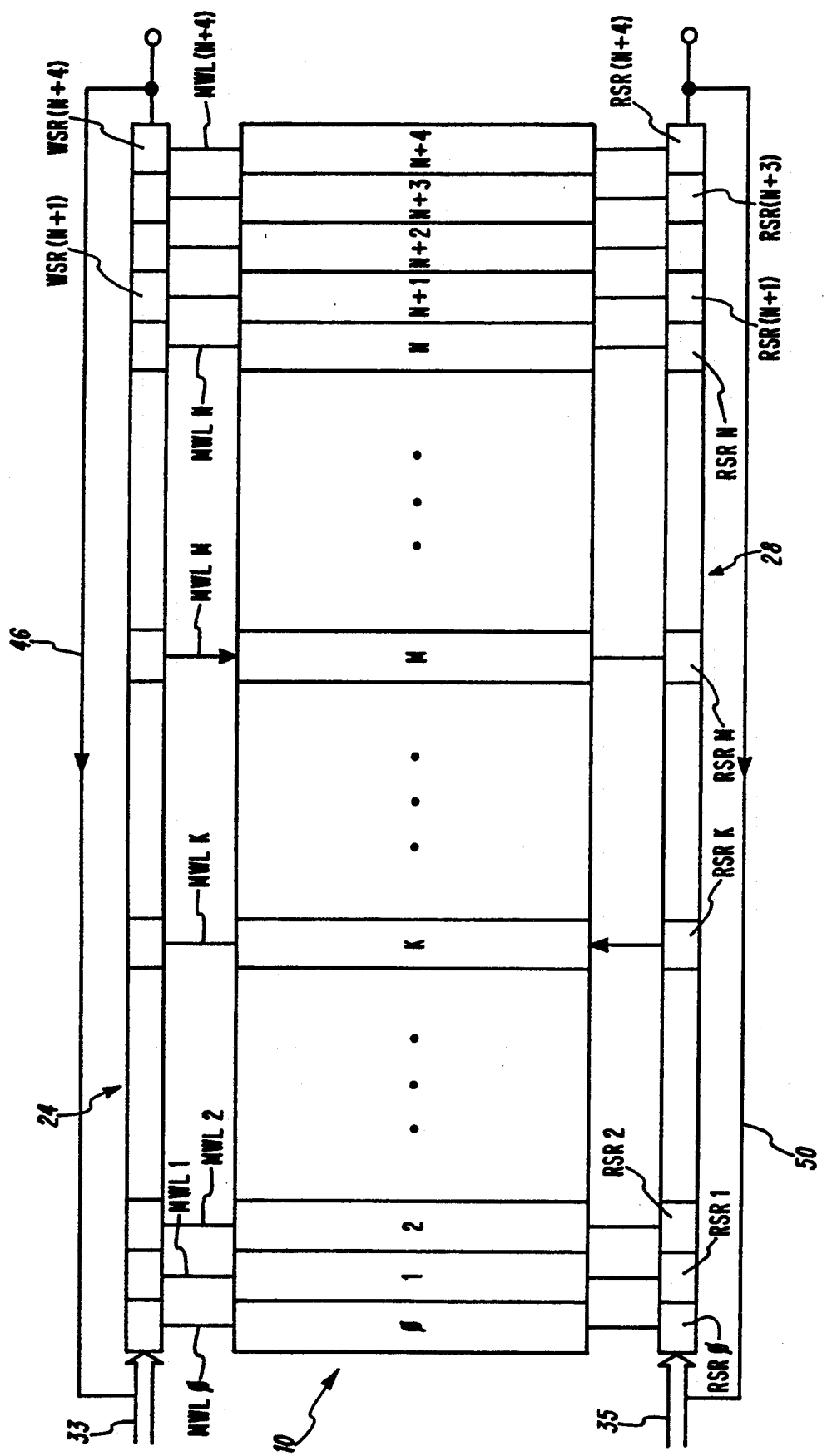
FIG. 7 is a simplified block diagram of a FIFO sequential memory having redundant memory cells and redundant READ and WRITE row shift pointer cells.
Figure 9:
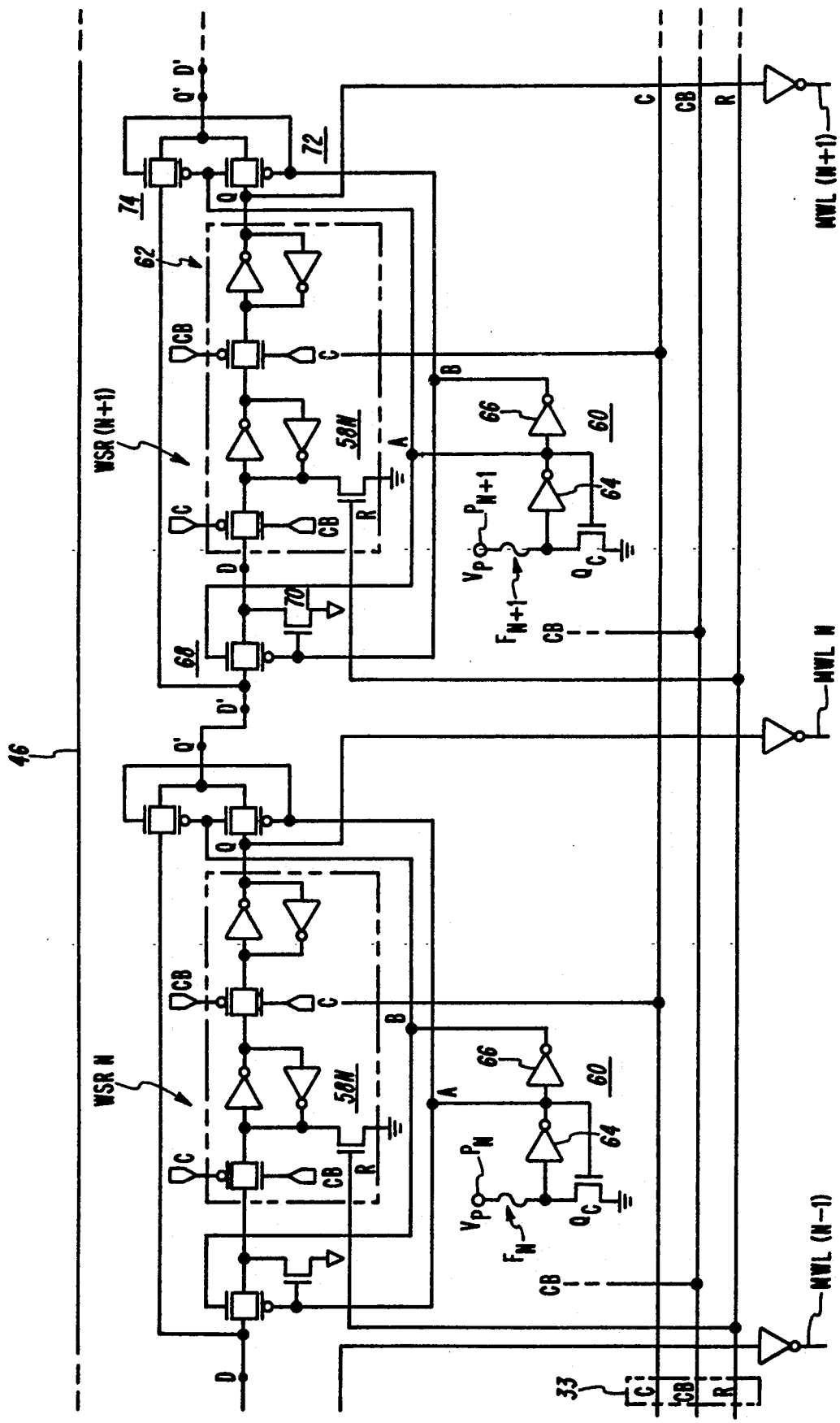

Referring now to FIG. 7 and FIG. 9, the repair buffer 60 and the multiplex logic circuit 62 are shown interconnected with the WRITE shift register WSR(N+1) for the first redundant memory block (N+1). This circuitry is identical in all respects with the circuitry shown in FIG. 8 except that the repair buffer output signals A, B are interchanged, whereby the redundancy block is normally bypassed while the fuse F is intact. According to this interchanged connection, the series coupled transmission gates 68 and 72 are turned OFF, and the parallel connected transmission gate 74 is turned ON. Consequently, when a non-negative program voltage is applied to the program terminal $P_{N+1}$, the input node D' is directly connected to the output node Q', whereby the shift register WSR(N+1) is bypassed, and the memory cell block (N+1) is also bypassed. Because the programmable fuse F is in the conducting condition, the data path selected by the multiplexer 62 is directly from input node D' to output node Q' as long as a non-negative program voltage $V_P$ is applied to the program terminal $P_{N+1}$. As a result, the shift register WSR(N+1) is effectively bypassed, and its associated memory cell block (N+1) is also bypassed.

If, during testing, it is determined that one of the primary memory cell blocks of the memory array 10 is faulty, for example memory block 2, it is desirable then to bypass memory block 2 and its associated shift register WSR2 by applying a negative program voltage $V_P$ to the program terminal $P_2$, thereby effectively bypassing primary memory block 2 as previously discussed. After the primary memory block and its READ/WRITE shift registers are bypassed, a relatively high, negative voltage $V_P = -25$ volts is applied to the program terminal $P_{N+1}$ of the redundant block (N+1). The application of the negative repair signal to the program terminal $P_{N+1}$ causes a positive gate voltage to be applied by the output of the inverter 64 to the gate of control transistor $Q_C$, thus delivering heavy current flow through the fuse $F_{N+1}$.

After the fuse $F_{N+1}$ has been opened by the heavy current flow, the drain of transistor $Q_C$ rises to $V_{SS}$, or logic 0 and the output of the inverter 64 rises to a logic 1 value. As a result, a logic 1 voltage level appears on repair buffer output line A, and a logic 0 appears on repair buffer output line B. This causes the bypass transistor 70 to turn OFF while transmission gates 68 and 72 are turned ON. According to this arrangement, the redundant shift register WSR(N+1) is permanently connected into the serial chain 24, with the input node D' being directly connected to the input node D of the shift register, and the output node Q of the shift register being directly connected to the output node Q'. Thus with the fuse $F_{N+1}$ permanently programmed to its open circuit condition, data may be written into and read out of the memory cells of the redundant block serially, in due course.

It will be appreciated that the present invention provides a redundant circuit for improving the yield and thereby lowering the cost of a serial memory array. This is achieved by providing redundant circuitry which can be selectively enabled to bypass a defective memory block including its associated READ/WRITE shift registers, and inserting at the end of the serial memory array a redundant block of memory cells and redundant READ/WRITE shift registers, thereby salvaging an otherwise defective chip. Implementation of the redundant circuitry is carried out by opening a total of four fuses per defect, thereby bypassing the READ/WRITE shift registers of a faulty memory block and thereby enabling the redundant READ/WRITE shift registers of the redundant memory block. The redundancy technique of the present invention may be carried out equally well during the testing stage both before and after encapsulation.

It will be appreciated that the foregoing technique allows most serial memory array defects to be repaired, and in addition, allows the replacement of defective shift registers in the READ and WRITE pointer registers. Consequently, a substantial increase in chip yield is achieved while incurring only a small increase in chip area.

Although the invention has been described in part by making detailed reference to a certain specific embodiment, such detail is intended to be, and will be understood to be, instructional rather than restrictive. It will be appreciated by those skilled in the art that many variations may be made in the structure and mode of operation without departing from the spirit and scope of the invention as disclosed herein.

What is claimed is:

1. A fault tolerant serial memory comprising, in combination:
   a serial array of primary memory blocks including a first memory block, one or more intermediate memory blocks and a last memory block, each memory block having data storage cells;
   a redundant memory block of data storage cells;
   a block selection circuit having data input and data output nodes coupled to each primary and redundant memory block, respectively, for writing and reading data into and out of said primary and redundant memory blocks, said block selection circuits interconnecting said primary memory blocks for enabling write and read operations from the first memory block sequentially to the last memory block in the serial array, and interconnecting the redundant memory block to the last primary memory block for enabling write and read operations from the first primary memory block of the serial array sequentially to the redundant memory block;
   a multiplexer circuit having a data input node and a data output node coupled to the data input and data output nodes of the block selection circuit for each intermediate memory block, for the last memory block and for said redundant memory block, respectively, each multiplexer circuit being operable in a first stable state in which block selection data is input to and output from each block selection circuit respectively, and each multiplexer circuit being operable in a second stable state in which the block selection circuit to which it is coupled is bypassed and block selection data is conducted from the multiplexer circuit data input node through a bypass path to the multiplexer circuit data output node, respectively.

2. The fault tolerant serial memory as defined in claim 1, including independently programmable means coupled to each multiplexer circuit means for logically enabling the transmission of block selection data exclusively through said block selection circuit means in said first stable state, and for logically enabling the transmission of block selection data exclusively through said bypass path in said second stable state.

3. In a serial memory system of the type including first, intermediate and last primary memory blocks each having data storage cells and first, intermediate and last write and read block selection circuit means coupled to the first, intermediate and last primary memory blocks, respectively, for writing and reading data into and out of the memory cells of each primary memory block, said block selection circuit means interconnecting said primary memory blocks for enabling write and read operations from the first memory block sequentially to the last memory block in the serial memory system, the improvement comprising:
   a redundant memory block of data storage cells;
   redundant block selection circuit means coupled to said redundant memory block for writing and reading data into and out of the memory cells of said redundant memory block, said redundant block selection circuit means interconnecting the redundant memory block to the last primary memory block for enabling write and read operations from the first primary memory block sequentially to the redundant memory block;

multiplexer circuit means having a data input node and a data output node coupled to each intermediate and last primary memory block and to said redundant memory block, respectively, each multiplexer circuit means being operable in a first stable state for enabling the transmission of block selection data exclusively to and from said block selection circuit means, and being operable in a second stable state for enabling the transmission of block selection data exclusively from each multiplexer data input node to each multiplexer data output node of each selected block selection circuit means, respectively; and independently programmable means coupled to each multiplexer circuit means for rendering each multiplexer circuit operable in a selected one of said first and second stable states.

4. A fault tolerant serial memory comprising, in combination:

a serial array of primary memory blocks including a first memory block, one or more intermediate memory blocks and a last memory block, each memory block having data storage cells;

a redundant memory block of data storage cells;

means coupled to said primary and redundant memory blocks for writing and reading data into and out of said primary and redundant memory blocks, respectively, each writing and reading means having a block pointer input node and a block pointer output node;

block selection circuit means interconnecting said primary memory blocks for enabling write and read operations from the first memory block sequentially to the last memory block in the serial array, and interconnecting the redundant memory block to the last memory block for enabling write and read operations from the first memory block of the serial array sequentially to the redundant memory block;

a multiplexer circuit having a data input node and a data output node coupled to each intermediate and last primary memory block and to each redundant memory block, each multiplexer circuit being operable in a first stable state in which a first data path is established from each multiplexer data input node to each block pointer input node and a second data path is established from each block pointer output node to each multiplexer data output node, and each multiplexer circuit being operable in a second stable state in which a bypass data path is established from each multiplexer data input node to each multiplexer data output node of each selected block selection circuit means; and programmable means coupled to each multiplexer circuit for rendering each multiplexer circuit operable in a selected one of said first and second stable states.

5. The fault tolerant serial memory as defined in claim 4, said multiplexer circuit comprising:

a first transmission gate connected between the multiplexer input data node and the block pointer data input node, a second transmission gate connected between the block pointer output node and the multiplexer output node, and a third transmission gate connected between the multiplexer input data node and the multiplexer output data node.

6. The fault tolerant serial memory as defined in claim 4, said independently programmable means comprising a repair buffer including a conductive fuse and a gate circuit coupled to said fuse for conducting heavy current flow through said fuse in response to a repair signal applied to the gate circuit, said repair buffer having first and second output nodes, said first and second output nodes having true and complement output signals corresponding with the closed circuit and open circuit condition of said fuse, respectively.

7. The fault tolerant serial memory as defined in claim 4, said independently programmable means comprising a repair buffer having an input node for receiving a programming signal, a gate control circuit, a conductive fuse coupling said gate control circuit to said programming input node, and having first and second output nodes, said first and second output nodes having true and complement output signals corresponding with the closed circuit and open circuit condition of said fuse, respectively.

8. The fault tolerant serial memory as defined in claim 4, each multiplexer including first and second primary transmission gates connected in series electrical relation with the block pointer input data node and the block pointer output data node, respectively, and having a bypass transmission gate connected across said multiplexer data input node and data output node, and in parallel with said series connected primary transmission gates.

9. The fault tolerant serial memory as defined in claim 4, each independently programmable means including a fuse and a repair buffer circuit coupled to said fuse, said repair buffer circuit having first and second output nodes coupled to the first and second primary bypass transmission gates, said repair buffer circuit developing enable and complement enable signals on the first and second output nodes, respectively, when said fuse is intact, and developing complement enable and enable signals on the first and second output nodes respectively, when said fuse is in the open circuit condition.

10. A fault tolerant FIFO memory comprising, in combination:

a serial array of primary memory blocks, each memory block having data storage cells;

a serial array of redundant memory blocks, each redundant memory block having data storage cells;

a serial array of shift registers for writing data into the memory cells of said primary and redundant memory blocks, each write shift register having a block pointer input node and a block pointer output node;

a serial array of shift registers for reading data out of the memory cells of said primary and redundant memory blocks, each read shift register having a block pointer input node and a block pointer output node;

block selection circuit means interconnecting said primary memory blocks and redundant memory blocks for enabling write and read operations from the first memory block of the primary array sequentially to the last memory block of the redundant array;

a multiplexer circuit coupled to each write shaft register and to each read shift register for each primary memory block and for each redundant memory block, respectively, each multiplexer circuit having a data input node and data output node coupled to each block pointer input node and each block pointer output node of each shift register, respectively, each multiplexer circuit being operable in a first stable state in which block selection data is input to and output from each block pointer input node and block pointer output node of the shift register to which it is connected, and operable in a second stable state for bypassing the shift register to which it is connected and enabling the transmission of block selection data exclusively from each multiplexer data input node to each multiplexer data output node of each selected block selection circuit means; and, independently programmable means coupled to each multiplexer circuit for rendering each multiplexer circuit operable in a selected one of said first and second stable states.

* * * * *